United States Patent [19]

Bloothoofd et al.

[11] 4,383,759
[45] May 17, 1983

[54] METHOD AND APPARATUS FOR PRODUCING A CAPPED PRINTING PLATE

[75] Inventors: William Bloothoofd, Wilmington, Del.; Norman E. Hughes, Landenberg, Pa.

[73] Assignee: Hercules Incorporated, Wilmington, Del.

[21] Appl. No.: 324,936

[22] Filed: Nov. 25, 1981

Related U.S. Application Data

[63] Continuation-in-part of Ser. No. 161,846, Jun. 23, 1980, abandoned.

[51] Int. Cl.³ .............................................. G03B 27/04
[52] U.S. Cl. ........................................ 355/85; 118/100; 118/407; 156/501; 430/307; 430/309; 430/325; 355/100; 355/125
[58] Field of Search ................... 355/85, 100, 18, 125; 430/18, 307, 309, 325, 347, 220; 156/501, 497, 500; 118/100, 407, 7

[56] References Cited

U.S. PATENT DOCUMENTS

| | | | |
|---|---|---|---|
| 3,145,410 | 8/1964 | Stahl | 118/100 |
| 3,520,606 | 7/1970 | Gush et al. | 355/85 |
| 3,605,689 | 9/1971 | Sherwood | 118/407 |
| 3,635,711 | 1/1972 | Miller et al. | 430/309 |
| 3,661,575 | 5/1972 | Ketley et al. | 430/307 |
| 3,663,222 | 5/1972 | Akamatsu et al. | 430/325 |
| 3,687,785 | 8/1972 | Akamatsu et al. | 156/501 |
| 3,729,256 | 4/1973 | Westfall et al. | 355/18 |
| 3,751,164 | 8/1973 | Miller et al. | 355/100 |
| 3,832,177 | 8/1974 | Akamatsu et al. | 430/347 |
| 3,837,887 | 9/1974 | Akamatsu et al. | 430/270 |
| 3,848,998 | 11/1974 | Yonekura et al. | 355/100 |
| 3,890,922 | 6/1975 | Nordenholt | 118/7 |
| 3,903,541 | 9/1975 | VonMeister et al. | 354/317 |
| 3,957,015 | 5/1976 | Harris | 355/125 X |
| 3,971,691 | 7/1976 | Cairns | 156/497 |
| 4,056,423 | 11/1977 | Hughes | 355/85 X |
| 4,087,182 | 5/1978 | Aiba et al. | 355/85 X |
| 4,214,942 | 7/1980 | Inoko et al. | 156/500 |
| 4,266,007 | 5/1981 | Hughes et al. | 430/18 |

*Primary Examiner*—Richard A. Wintercorn
*Attorney, Agent, or Firm*—Marion C. Staves

[57] ABSTRACT

An apparatus and method is disclosed which will rapidly provide uniform layers of two liquid photopolymerizable materials for a capped (i.e., two layer) printing plate. The apparatus comprises a dual manifold which spans the plate-forming area of a surface and which is moved in tandem transversely in order to provide two overlapping layers of liquid photopolymerizable materials.

3 Claims, 3 Drawing Figures

METHOD AND APPARATUS FOR PRODUCING A CAPPED PRINTING PLATE

This application is a continuation-in-part of copending application Ser. No. 161,846, filed June 23, 1980, now abandoned.

SUMMARY OF THE INVENTION

The present invention relates to a method and apparatus for the preparation of capped printing plates (i.e., a printing plate prepared from several layers usually having different hardnesses). More particularly, this invention relates to a method and apparatus which will rapidly provide two uniform layers of liquid photopolymerizable material for a printing plate, in which a regulated flow of two liquid photopolymerizable resins is supplied from two external reservoirs into two manifolds which operate in tandem to deposit uniform layers of the two resins on a platemaking surface.

BACKGROUND OF THE INVENTION

Traditionally, plates for printing presses were produced by hand and were set with moveable type. This method later gave way to automatic machines, such as linotypes. In recent years, printing systems have been introduced which produce printing plates directly from photohardenable material. By exposing such a material to actinic light through a negative image, a selective hardening is obtained which can be used as a printing surface.

Most commonly, the material used for such plates is a photopolymerizable resin. This resin must be spread in an even and uniform layer on a surface on which a negative image has been positioned. Since these resins typically have a high viscosity, it is difficult to provide an even and uniform layer in a short period of time, and the longer the preparation required, the greater the cost of the finished printing plate to the customer.

Most commonly, a layer of photopolymerizable material is applied by depositing a quantity of material on the platemaking surface and then spreading the material by drawing a doctor blade or nip roller along the plate. Various controls have been introduced in order to provide a more uniform deposit of material which is then spread along the platemaking surface. U.S. Pat. No. 3,957,015 shows a polymer flow control system for use in the manufacture of printing plates. The disclosed control system is used in conjunction with a pressurized feed system, and provides multiple spring tensioned dispense controls to assist in the proper distribution of the photopolymerizable material across the width of the platemaking surface. The deposited material is then spread along the lengthwise direction of the platemaking surface. In addition to the multiple dispense controls, footlike extenders at the periphery of the doctor blade are provided to prevent material from spreading beyond the platemaking area of the surface until the material can be spread.

Unfortunately, the use of either a doctor blade or a nip roller, or a combination of these mechanisms, to spread a large amount of viscous material leads to phenomena which prevent the deposition of an accurate and uniform layer. In the case of the use of a doctor blade, a slight cavitation occurs behind the blade as it passes along the plate, and the layer formed is slightly thinner than the height of the doctor blade. In the case of a nip roller, material tends to gather behind the roller as it moves along the plate and a layer formed by such a roller is slightly thicker than the height of the nip roller. The magnitude of either of these effects will depend on such variables as the speed of travel along the platemaking surface of the blade or roller, the viscosity of the material, and the amount of material before the blade or roller which must be moved along.

In addition, it is often customary in this field to apply a sheet of plastic film over the layer of photopolymerizable material to act as a substrate for the finished plate as shown in U.S. Pat. No. 3,937,887 to Akamatsu et al. This sheet is normally laid down by a large roller which follows the doctor blade or nip roller as it travels along the platemaking surface spreading the photopolymerizable material. In the conventional art, variances in the plate thickness as a result of doctor blade or nip roller phenomena during spreading will also result in variances in plate thickness as a result of nip roller phenomena when such a substrate is placed over the layer in this manner.

Mechanisms such as tilt buckets or the bottom opening bucket shown in U.S. Pat. No. 4,056,423, have been used to bring some control to the flow of material onto the platemaking surface, thereby somewhat reducing the amount of material which the doctor blade or nip roller must move along the length of the plate, but there are certain problems associated with these mechanisms. Firstly, such a moveable reservoir must hold the entire amount of material used to make up the layer, usually with some excess to allow for the material's viscosity. Thus, such a reservoir must be of a substantial size, and must be refilled after each plate is made.

In addition, to attempt to keep a relatively constant flow of material during the course of travel along the platemaking surface, the degree of tilt in a tilt bucket, or the width of the opening in a bottom opening bucket, must be varied as the reservoir travels along the surface. This is done to compensate for the speed of travel and the constantly changing relationship between the gravity head of the material in the reservoir and the various other minor forces acting on the material.

To compensate for the irregularities caused by the prior art mechanisms, very often a larger amount of resin than needed was deposited and spread on the platemaking surface. Initially, this resulted in a layer thicker in the center and tapering toward the edges. Even after a wait of 2 or 3 minutes and using an upper weighted flat surface resting on the layer, a layer of uniform thickness might not result. A printing plate made using such a layer would produce dark areas of printing in the center of the plate with lighter areas around the edges.

Recent advances in the art of platemaking from liquid photopolymer resin materials has led to the preparation of multilayer printing plates as disclosed in U.S. Pat. No. 4,266,007. Generally, two layers having different hardnesses are desired, i.e., a soft bottom layer used in combination with a harder top layer can result in improved print quality. For some purposes it may be desirable to have a hard bottom layer and softer top layer. Whichever is desired, it is critical that both layers be of uniform thickness. As indicated above, there are many problems in obtaining a single uniform layer. It should be obvious that those problems are multiplied when one attempts to obtain two uniform layers.

OBJECTS OF THE PRESENT INVENTION

It is an object of the present invention to provide an apparatus capable of rapidly producing two uniform overlapping and contiguous layers of different liquid photopolymer resin materials, which apparatus comprises dual manifolds which span the plateforming area of a surface and which are moved in tandem transversely to provide from each manifold uniform curtains of photopolymerizable resin materials which are continuously fed into each manifold from external reservoirs under pressure.

The other objects, features, and advantages of the present invention are pointed out with particularity in the claims annexed to this specification. Further, they will become more apparent in light of the following detailed description of the preferred embodiment thereof and as illustrated in the accompanying drawings.

According to the preferred embodiment of the present invention, an apparatus to rapidly provide uniform overlapping layers of two different liquid photopolymer resin materials for a capped printing plate is provided, which comprises: a platemaking surface; a first manifold, vertically adjustable, spanning the width of the platemaking surface and moveable along the lengthwise direction of said surface, which manifold is approximately C-shaped in cross-section having a closed upper side and a bottom side, a forward facing side having a plurality of openings for the attachment of resin supply tubes and a back facing side depending toward but not in contact with the back edge of said bottom side and defining an opening across the length of said manifold adjacent said bottom side, and closed ends; means to vertically adjust said first manifold upward and downward; a first gate, vertically nonadjustable, mounted against the back facing side of said first manifold and being essentially the same length as said first manifold, which gate has a back facing exterior surface, a forward facing interior surface, a top edge and a bottom edge, the lower portion of the exterior surface being beveled downward at an angle toward the bottom edge of the interior surface to form a doctor blade along the bottom edge of said gate, the said first gate being mounted against the back facing side of the first manifold so that the bottom edge of the gate extends below the bottom side of said first manifold, said first gate having a cutaway portion along its interior surface adjacent the opening in the back facing side of said first manifold, forming, when said first manifold is adjusted vertically upward, a passageway between the cutaway portion of the interior surface of said gate and the back edge of the bottom side of said first manifold, thereby defining a first adjustable orifice slot extending the length of the opening in the first manifold, and when said first manifold is adjusted vertically downward, completely closing the said first orifice slot; means to supply a regulated flow of first liquid photopolymerizable resin material from a first pressurized external reservoir through said resin supply tubes attached to said plurality of openings in said first manifold; and, a second manifold, vertically nonadjustable, spanning the width of the platemaking surface and being essentially the same length as the first manifold, said second manifold being positioned directly behind the first manifold and moveable in tandem with said first manifold along the lengthwise direction of said surface, said second manifold being approximately C-shaped in cross-section having a closed bottom side having a wedge shaped lip projecting downward from its forward edge and forming a doctor blade, the distance between the bottom of the wedge shaped lip and the platemaking surface being greater than the distance between the bottom edge of the first gate and the platemaking surface, a closed back facing side, an upper side having a plurality of openings for the attachment of resin supply tubes, a forward facing side depending toward but not in contact with the forward edge of said bottom side and defining an opening across the length of said second manifold adjacent said bottom side, and closed ends; a second gate being essentially the same length as said second manifold, disposed before the opening in the second manifold and vertically adjustable so that, when adjusted upward, its lower edge will define with the opening in the second manifold a second adjustable orifice slot extending the length of the opening in the second manifold and, when adjusted downward, completely closing the said second orifice slot; means to vertically adjust said second gate upward and downward; means to prevent air from entering between the second gate and the upper section of the forward facing side of the second manifold; and means to supply a regulated flow of a second liquid photopolymerizable resin material from a second pressurized external reservoir through said resin supply tubes attached to said plurality of openings in said second manifold.

It will be understood that the term "first manifold" used in the specification and claims refers to the leading manifold which lays down the first or capping layer of photopolymerizable resin material. The "second manifold" refers to the following manifold which lays down the second or base layer of photopolymerizable resin material. Since the layers are exposed through a negative from the bottom, it will be understood that the position of the layers will be reversed in the resulting printing plate—i.e., the capping layer, which is on the bottom in the apparatus, will be on the top in the resulting printing plate. The term "forward facing" used in the specification and claims refers to the direction in which the apparatus is moving when actually laying down layers of resin material for a printing plate. The term "backward facing" refers to the direction opposite from "forward facing".

It will be obvious to those skilled in the art that various means can be used to adjust the first manifold and a second gate upward and downward. One such means is electrically actuated pneumatic cylinders. Such means is shown below in the drawings. It may additionally be advantageous to provide means to hold the gates tightly against the manifold and limit the upward travel of the first manifold and second gate. With respect to the first manifold and first gate, it may be desirable to extend the gate at a right angle over the upper side of the manifold and attach brackets to the forward facing edge of the extension as shown in the drawings to hold the manifold tightly against the gate. It may also be desirable to provide adjustable bolts, such as wing bolts, passing through the extension of the first gates as shown in the drawing, to limit the upward travel of the first manifold. With respect to the second manifold and second gate, it may be desirable to provide stop brackets attached to the manifold and provided with bolts, as shown in the drawings, to hold the second gate tightly against the second manifold and limit the upward travel of the second gate.

BRIEF DESCRIPTION OF THE DRAWINGS

In the drawings, like numbers are used for like parts.

DETAILED DESCRIPTION OF THE DRAWINGS

Figure 1:
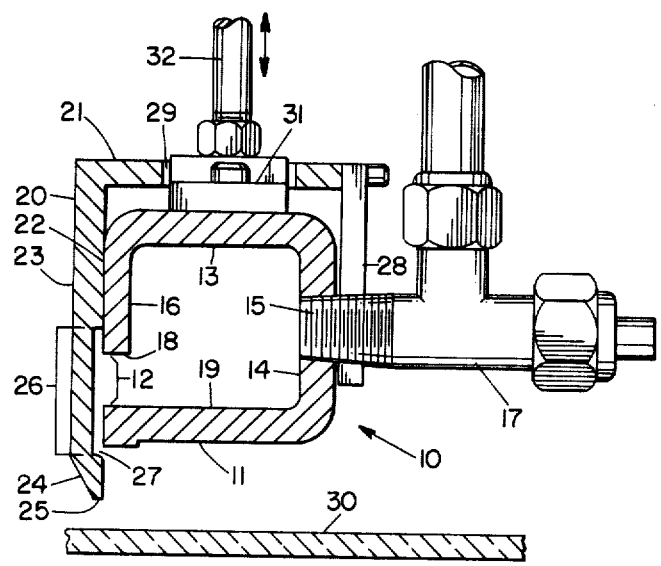
FIG. 1 shows a view of the first manifold and gate partly in cross-section.

The first manifold and gate unit is shown in FIG. 1. As shown in cross-section, the first manifold (10) is approximately C-shaped in cross-section. As shown, the first manifold (10) has a closed bottom side (11), a closed upper side (13), a forward facing side (14) having a plurality of openings, one shown as (15) in FIG. 1, for the attahcment of resin supply tubes, one shown as (17) in FIG. 1, and a back facing side (16). Back facing side (16) depends toward but does not contact bottom side (11). The lower edge (18) of the back facing side (16) and the upper surface (19) of the bottom side (11) define an opening (12) throughout the length of the first manifold (10). A first liquid photopolymerizable resin material is supplied from a first external reservoir (not shown in drawing) through openings, such as (15), and into the enclosure of the first manifold (10). The first manifold (10) has closed ends (not shown in drawing).

A first gate (20) is mounted against the back facing side (16) of the first manifold (10). The first gate (20) may have, as shown in FIG. 1, a right angle extension (21) extending across and above the upper side (13) of the first manifold (10). The first gate (20) has a forward facing interior surface (22) and a back facing exterior surface (23). The lower portion (24) of the back facing exterior surface (23) of the first gate (20) is beveled downward at an angle toward the bottom edge of the interior surface (22) of the first gate (20) to form a doctor blade (25) along the bottom edge of said gate. The forward facing interior surface (22) is provided with a cutaway section (26), which, when the first manifold (10) is adjusted vertically upward, defines a first orifice slot (27), which will discharge a uniform curtain of first photopolymerizable resin onto a platemaking surface (30). Also shown in FIG. 1 is a bracket (28) attached to the extension (21) of the first gate (20) extending down the forward facing side (14), which bracket holds the first gate (20) tightly against the back facing side (16) of the first manifold (10). The first manifold (10) can be vertically adjusted upward and downward. Shown in FIG. 1 is the lower end of the connector rod (32) and attachment means (31) which fits through an opening (29) in the extension (21) of the first gate (20) and attaches the connector rod (32) to the first manifold (10). The connector rods, such as (32), are driven upward and downward (shown by arrows) by a driving means (not shown in FIG. 1), thus adjusting the first manifold (10) vertically upward and downward.

Figure 2:
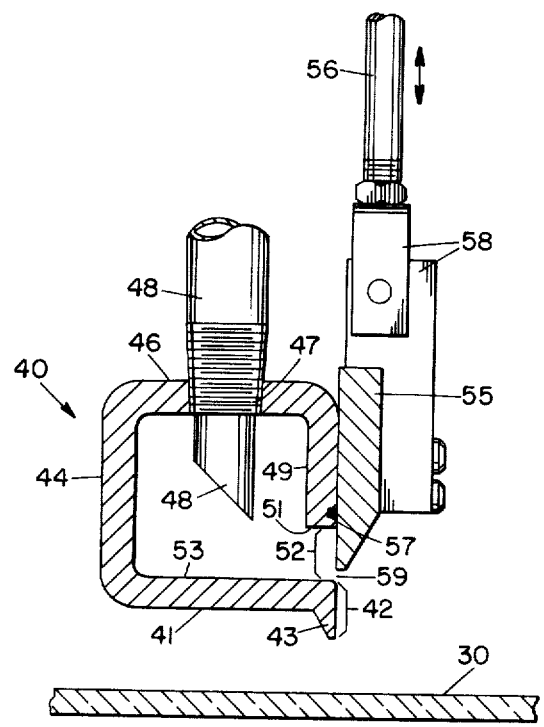
FIG. 2 shows a view of the second manifold and gate partly in cross-section.

The second manifold and gate unit is shown in FIG. 2. As shown in cross-section, the second manifold (40) is approximately C-shaped in cross-section. As shown, the second manifold (40) has a closed bottom side (41) having a wedge shaped lip (43) projecting downward from its forward edge (42) forming a doctor blade, a closed back facing side (44), an upper side (46) having a plurality of openings, one shown as (47) in FIG. 2, for the attachment of resin supply tubes, one shown as (48) in FIG. 2, and a forward facing side (49). Forward facing side (49) depends toward but does not contact bottom side (41). The lower edge (51) of the forward facing side (49) and the upper surface (53) of the bottom side (41) define an opening (52) throughout the length of the second manifold (40). A second liquid photopolymerizable resin is supplied from a second external reservoir (not shown in drawing) through resin supply tubes such as (48), through the openings, such as (47), and into the enclosure of the second manifold (40). Since the resin is supplied to the manifold (40) through openings in the upper side (46), it is advantageous to extend the supply tube (48) downward into the manifold enclosure below the surface of the resin and to cut the end of the tube (48) at a 45° angle for the reasons discussed below. The second manifold (40) has closed ends (not shown in the drawing).

A second gate (55) is mounted against the forward facing side (49) of the second manifold (40). It is advantageous to provide a sealing means between the second gate (55) and the forward facing side (49) to prevent air from penetrating into the resin from above the opening (52). In FIG. 2, the sealing means is an elastomeric seal shown as (57) provided in a groove in the forward facing side (49) of the second manifold (40). The second gate (55) is vertically adjustable. The second gate (55) is attached to connector rods; one is shown as (56) in FIG. 2, through attachment means (58). The connector rods, such as (56), are driven upward and downward (shown by arrows) by a driving means (not shown in FIG. 2), thus adjusting the second gate (55) vertically upward and downward. When the second gate (55) is adjusted upward, it, together with the opening (52) in the forward facing side (49) of the second manifold (40), defines a second orifice slot (59) which will discharge a uniform curtain of second photopolymerizable resin onto a platemaking surface (30) over the layer of first photopolymerizable resin laid down by the first manifold (10).

Figure 3:
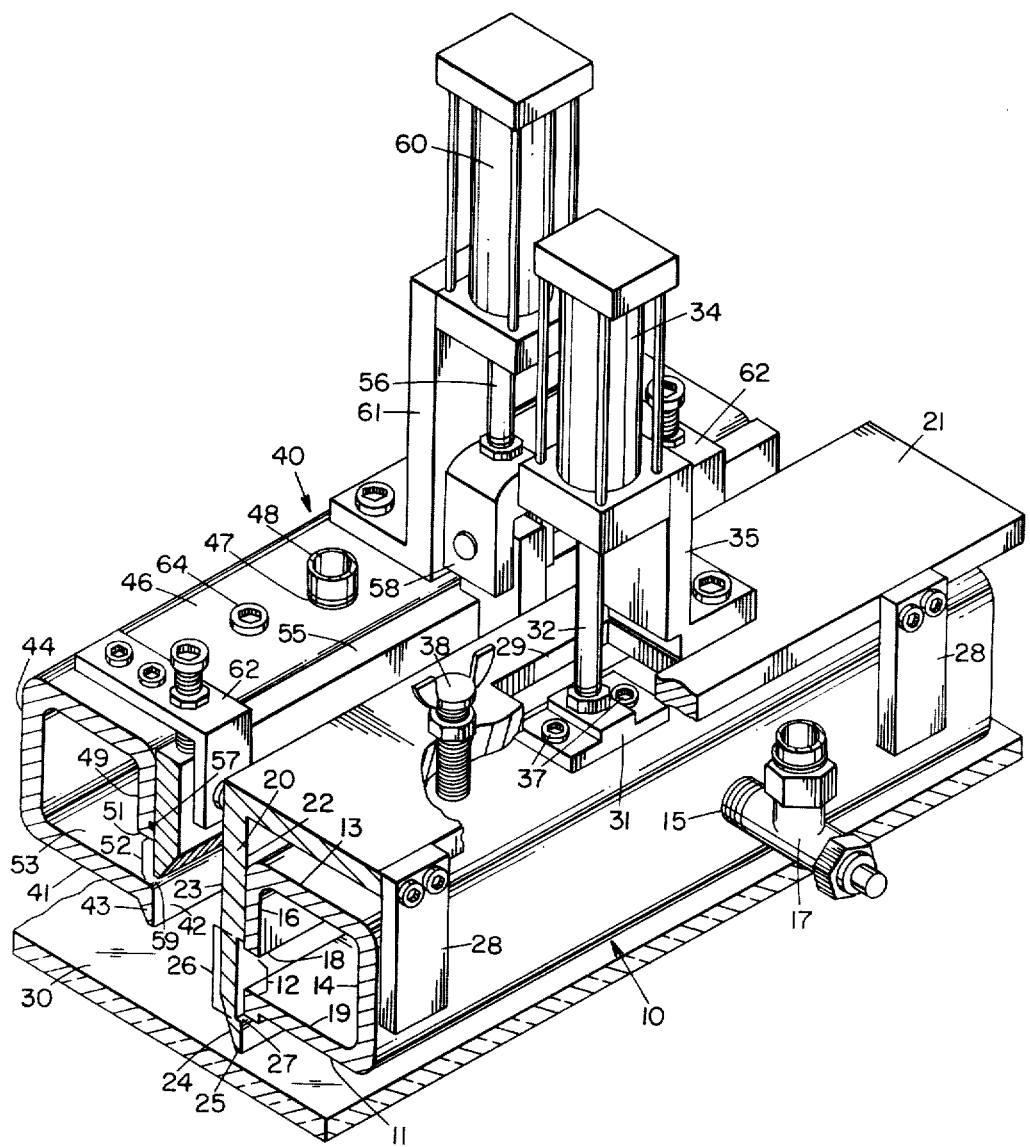
FIG. 3 shows a perspective view of one embodiment of the present invention.

In FIG. 3, the dual manifolds comprising an embodiment of the apparatus of this invention is shown in a perspective view. In addition to the parts shown in FIG. 1 and FIG. 2, FIG. 3 shows a first pneumatic cylinder (34) supported by first support bracket (35), used to drive the connector rod (32) through an opening (29) in the extension (21) of the first gate (20) and thus raise and lower the first manifold (10). The connector rod (32) is attached to the first manifold through attachment means (31). Shown in FIG. 3 are bolts (37) holding the attachment means (31) to the first manifold (10). It is advantageous to provide that one of the bolts (37) goes through the upper side (13) of the first manifold (10), so that it can be used as a purge screw, which can be opened to allow air to escape when the manifold (10) is being filed with the first liquid photopolymer resin. FIG. 3 also shows a second pneumatic cylinder (60), supported by second support bracket (61), used to drive the connector rod (56) and thus raise and lower the gate (55). Means to limit the upward travel of the first manifold (10) and second gate (55) is shown in FIG. 3. The stop bracket (62), attached to the second manifold (40) and provided with a bolt, limits the upward travel of the second gate (55) and thus controls the width of the second orifice slot (59). The wing bolts, one shown as (38), projecting through and below the extension (21) on the first gate (20), limits the upward travel of the first manifold (10) and thus controls the width of the first orifice slot (27). The downward travel of the first manifold (10) and second gate (55) is controlled by the connector rods (32 and 56) to prevent the first manifold (10) from being lowered below the edge of the doctor blade (25) on the first gate (20) or the second gate (55) from being lowered below the wedge shaped lip (22) which forms a doctor blade on the second manifold (40). Also shown in FIG. 3 is a purge screw (64) through the upper side (46) of the second manifold (40) which can be opened to allow air to escape from the manifold (40) when it is being filled with the second liquid photopolymer resin.

The apparatus of FIG. 3 can be used to rapidly provide two uniform layers of different liquid photopolymerizable resin materials in the following manner.

A negative of the image to be printed is disposed above a transparent horizontal surface above an actinic light source and this negative is then covered with a thin sheet of protective film. First and second liquid photopolymerizable materials from a first and second external reservoir are supplied under pressure to the interiors of the first (10) and second manifolds (40) through the respective resin supply tubes (17 and 48). Air is allowed to escape from the first manifold (10) by opening a bolt (37) on attachment means (31) and from the second manifold (40) by opening purge screw (64). After the manifolds are filled, the bolt (37) and purge screw (64) are closed.

At some point, the first manifold (10) is raised and adjusted until a first orifice slot (27) of the desired height is defined between the cutaway section (26) on the interior surface (22) of the first gate (20) and the back edge of the bottom side (11) of the first manifold (10). The first liquid photopolymerizable resin material flows from the interior of the first manifold (10) as a uniform curtain through the first orifice slot (27) and onto the platemaking surface (30). A very small amount of material is allowed to build up to form a small bead across the platemaking surface (30).

The apparatus, which is moveable along the lengthwise direction of the platemaking surface (30), is then moved from its initial position at one end of the platemaking surface (30) toward the other end of the platemaking surface (30). When the second manifold (40) reaches the position along the platemaking surface (30) where the first manifold (10) started to lay down the first layer of photopolymerizable resin material, the second gate (55), disposed before the opening (52) in the forward facing side (49) of the second manifold (40), is raised and adjusted until a second orifice slot (59) of the desired height is defined between the said second gate (55) and the opening (52). The second liquid photopolymerizable resin material flows from the interior of the second manifold (40) as a uniformed curtain through the second orifice slot (59) and down the forward edge (42) of the bottom side (41) of the second manifold (40) and onto the first layer of photopolymerizable material being laid down by the first manifold (10). The dual manifolds (10 and 40) move in tandem along the lengthwise direction of the platemaking surface (30). This movement causes the bottom edge (25) of the first gate (20) and the wedge shaped lip (43) of the bottom side (41) of the second manifold (40) to act as doctor blades on the resin material being deposited on the plate-making surface (30). The speed of travel of the apparatus is adjusted such that it will cooperate with a constant flow of resin material from the first and second orifice (27 and 59) onto the platemaking surface (30) to maintain small beads of the two resins in front of each doctor blade during the travel of the apparatus along the platemaking surface (30). In this manner, variances in the thicknesses of the layers as a result of the so called doctor blade phenomena are negated since each doctor blade is called on to push a small and constant amount of photopolymerizable resin material along the platemaking surface (30).

The wedge shaped lip (43) on the bottom side (41) of the second manifold (40) is maintained at a distance from the platemaking surface (30) greater than the distance between the bottom edge (25) of the first gate (20) and the plate-making surface (30). These distances can be adjusted to obtain layers of differing thicknesses.

When the first manifold (10) has completely traversed the platemaking area, it is adjusted vertically downward closing the first orifice slot (27) and stopping the flow of the first liquid photopolymerizable resinous material. When the second manifold reaches the end of the platemaking area, the second gate (55) is adjusted downward, thus closing the second orifice slot (59) and stopping the flow of the second liquid photopolymerizable resinous material. The apparatus continues past the platemaking surface (30) and stops; the two layers of photopolymerizable resin material are covered with a substrate film simultaneous with the casting of resin layers and the whole is exposed to actinic light through the transparent horizontal surface; the negative and protective film are removed and the plate developed by removing unpolymerized material by washing with a solvent. The specific solvent used will depend upon the photopolymerizable resins being used.

It may also be useful to provide a second actinic light source above the photopolymerizable resin layers, and this may be done with the present invention.

As indicated above, the second manifold (40) is provided with means to prevent air from entering and possibly forming bubbles in the photopolymerizable resin and degrading the resulting printing plate. Depending upon the viscosity of the resin and the fit of the second gate against the second manifold, it is possible for air to leak into the manifold between the second gate and the section of the forward facing side of the second manifold above the opening. Several different means to prevent air from entering the second manifold can be used. For example, an elastomeric seal can be provided in a groove spanning the length of the second manifold above the opening in the forward facing side of said manifold. Such a seal can be merely a strip of rubber or plastic which fits in a groove and seals against the second gate. The problem of air entering and forming bubbles has not been observed in the case of the first manifold (10).

When operating the apparatus, the dual manifolds will first be completely filled with liquid resins. In order to purge all air from the manifolds, a bolt through the first manifold and a purge screw through the second manifold can be loosened and left open until liquid resin starts to leak out. If the resin supply tubes enter the upper side of the manifold, as in the second manifold in the instant apparatus, it is preferable that the ends of the tubes extend downward below the surface of the resin during normal operation, in order to prevent the formation of air bubbles. It is also preferable to cut the ends of the tubes at approximately a 45 degree angle facing backwards so that the liquid resin forms a uniform curtain as it leaves the manifold. If the resin supply tubes enter a side of the manifold, as they do in the first manifold of the instant apparatus, there is no problem with air bubbles and the resin supply tubes can be cut flush with the inner surface of the manifold. The actual number of resin supply tubes will depend upon the width of the manifolds. With relatively short manifolds, three tubes per manifold should be sufficient—longer manifolds may require four or more tubes per manifold.

The apparatus of this invention can be used with many different liquid photopolymerizable resins for preparing printing plates. Typical resins which can be used in the apparatus and method of this invention are those disclosed in U.S. Pat. No. 4,266,007.

It will be obvious to those skilled in the art that the apparatus of this invention can be used to prepare printing plates of various thicknesses from only a few mils to an inch or more. It will also be obvious that the two layers of the printing plates prepared according to this invention can vary in thickness; one from the other, or if desired, be of equal thicknesses.

Other features, advantages and specific embodiments of this invention will become readily apparent to those exercising ordinary skill in the art after reading the foregoing disclosures. These specific embodiments are within the scope of the claimed subject matter unless otherwise expressly indicated to the contrary. Moreover, while specific embodiments of this invention have been described in considerable detail, variations and modifications of these embodiments can be effective without departing from the spirit and scope of the invention as disclosed and claimed.

What we claim and desire to protect by Letters Patent is:

1. An apparatus to provide uniform overlapping layers of two liquid photopolymerizable resin materials on a platemaking surface in the manufacture of a capped printing plate from said resin materials, said apparatus comprising:
    a platemaking surface;
    a first manifold, vertically adjustable, spanning the width of the platemaking surface and moveable along the lengthwise direction of said surface, which manifold is approximately C-shaped in cross-section having a closed upper side and bottom side, a forward facing side having a plurality of openings for the attachment of resin supply tubes and a back facing side depending toward but not in contact with the back edge of said bottom side and defining an opening across the length of said manifold adjacent said bottom side, and closed ends;
    means to vertically adjust said first manifold upward and downward;
    a vertically nonadjustable first gate mounted against the back facing side of said first manifold and being essentially the same length as said first manifold, which gate has a back facing exterior surface, a forward facing interior surface, a top edge and a bottom edge, the lower portion of the exterior surface being beveled downward at an angle toward the bottom edge of the interior surface to form a doctor blade along the bottom edge of said gate, the said first gate being mounted against the back facing side of the first manifold so that the bottom edge of the gate extends below the bottom side of said first manifold, said first gate having a cutaway portion along its interior surface adjacent the opening in the back facing side of said first manifold forming, when said first manifold is adjusted vertically upward, a passageway between the cutaway portion of the interior surface of said gate and the back edge of the bottom side of said first manifold, thereby defining a first adjustable orifice slot extending the length of the opening in the first manifold, and when said first manifold is adjusted vertically downward, completely closing the said first orifice slot;
    means to supply a regulated flow of first liquid photopolymerizable resin material from a first pressurized external reservoir through said resin supply tubes attached to said plurality of openings in said first manifold; and,
    a second manifold, vertically nonadjustable, spanning the width of the platemaking surface and essentially the same length as the first manifold, said second manifold being positioned directly behind the first manifold and moveable in tandem with said first manifold along the lengthwise direction of said surface, said second manifold being approximately C-shaped in cross-section having a closed bottom side having a wedge shaped lip projecting downward from its forward edge and forming a doctor blade, the distance between the bottom of the wedge shaped lip and the platemaking surface being greater than the distance between the bottom edge of the first gate and the platemaking surface, a closed back facing side, an upper side having a plurality of openings for the attachment of resin supply tubes, a forward facing side depending toward but not in contact with the forward edge of said bottom side and defining an opening across the length of said second manifold adjacent said bottom side, and closed ends;
    a second gate being essentially the same length as said second manifold, disposed before the opening in the second manifold and vertically adjustable so that, when adjusted upward, its lower edge will define with the opening in the second manifold a second adjustable orifice slot extending the length of the opening in the second manifold and when adjusted downward, completely closing the said second orifice slot;
    means to vertically adjust said second gate upward and downward;
    means to prevent air from entering between the second gate and the upper section of the forward facing side of the second manifold; and
    means to supply a regulated flow of second liquid photopolymerizable resin material from a second pressurized external reservoir through said resin supply tubes attached to said plurality of openings in said second manifold.

2. The apparatus of claim 1 wherein the means to prevent air from entering between the second gate and the upper section of the forward facing side of the second manifold is an elastomeric seal provided in a groove spanning the length of the second manifold above the opening in the forward facing side of said manifold.

3. A method for the preparation of a capped photopolymerized printing plate, comprising the steps of:
    (a) providing a horizontal platemaking surface above an actinic light source, which platemaking surface is transparent to such light source;
    (b) positioning a negative of the image to be printed on said platemaking surface;
    (c) covering said negative with a thin sheet of protective film which is transparent to the actinic light source;

(d) providing a uniform first layer of a liquid photopolymerizable resin of a first composition, and a uniform second layer of a liquid photopolymerizable resin of a second composition with an apparatus comprising:

said horizontal platemaking surface;

a first manifold, vertically adjustable, spanning the width of the platemaking surface and moveable along the lengthwise direction of said surface, which manifold is approximately C-shaped in cross-section having a closed upper side and bottom side, a forward facing side having a plurality of openings for the attachment of resin supply tubes and a back facing side depending toward but not in contact with the back edge of said bottom side and defining an opening across the length of said manifold adjacent said bottom side, and closed ends;

means to vertically adjust said first manifold upward and downward;

a vertically nonadjustable first gate mounted against the back facing side of said first manifold and being essentially the same length as said first manifold, which gate has a back facing exterior surface, a forward facing interior surface, a top edge and a bottom edge, the lower portion of the exterior surface being beveled downward at an angle toward the bottom edge of the interior surface to form a doctor blade along the bottom edge of said gate, the said first gate being mounted against the back facing side of the first manifold so that the bottom edge of the gate extends below the bottom side of said first manifold, said first gate having a cutaway portion along its interior surface adjacent the opening in the back facing side of first manifold forming, when said first manifold is adjusted vertically upward, a passageway between the cutaway portion of the interior surface of said gate and the back edge of the bottom side of said first manifold, thereby defining a first adjustable orifice slot extending the length of the opening in the first manifold, and when said first manifold is adjusted vertically downward, completely closing the said first orifice slot;

means to supply a regulated flow of first liquid photopolymerizable resin material from a first pressurized external reservoir through said resin supply tubes attached to said plurality of openings in said first manifold; and a second manifold, vertically nonadjustable, spanning the width of the platemaking surface and essentially the same length as the first manifold, said second manifold being positioned directly behind the first manifold and moveable in tandem with said first manifold along the lengthwise direction of said surface, said second manifold being approximately C-shaped in cross-section having a closed bottom side having a wedge shaped lip projecting downward from its forward edge and forming a doctor blade, the distance between the bottom of the wedge shaped lip and the platemaking surface being greater than the distance between the bottom edge of the first gate and the platemaking surface, a closed back facing side, an upper side having a plurality of openings for the attachment of resin supply tubes, a forward facing side depending toward but not in contact with the forward edge of said bottom side and defining an opening across the length of said second manifold adjacent said bottom side, and closed ends;

a second gate being essentially the same length as said second manifold, disposed before the opening in the second manifold and vertically adjustable so that, when adjusted upward, its lower edge will define with the opening in the second manifold a second adjustable orifice slot extending the length of the opening in the second manifold and when adjusted downward, completely closing the said second orifice slot;

means to vertically adjust said second gate upward and downward;

means to prevent air from entering between the second gate and the upper section of the forward facing side of the second manifold; and means to supply a regulated flow of second liquid photopolymerizable resin material from a second pressurized external reservoir through said resin supply tubes attached to said plurality of openings in said second manifold;

(e) providing over said second layer a sheet of substrate film;

(f) exposing the assembly of step (e) to uniform radiation from the lower actinic light source through the negative to selectively expose and polymerize portions of the photopolymerizable resin layers; and (g) removing the remaining unexposed photopolymerizable resin material of both layers.

* * * * *